United States Patent [19]
Hayano

[11] Patent Number: 5,305,280
[45] Date of Patent: Apr. 19, 1994

[54] SEMICONDUCTOR MEMORY DEVICE HAVING ON THE SAME CHIP A PLURALITY OF MEMORY CIRCUITS AMONG WHICH DATA TRANSFER IS PERFORMED TO EACH OTHER AND AN OPERATING METHOD THEREOF

[75] Inventor: Kohji Hayano, Hyogo, Japan

[73] Assignee: Mitsubishi Denki Kabushiki Kaisha, Tokyo, Japan

[21] Appl. No.: 862,499

[22] Filed: Apr. 2, 1992

[30] Foreign Application Priority Data

Apr. 4, 1991 [JP] Japan .................................. 3-071746

[51] Int. Cl.$^5$ .............................................. G11C 8/00
[52] U.S. Cl. ........................... 365/230.03; 365/189.04; 365/230.06
[58] Field of Search ...................... 365/230.01, 230.03, 365/189.04, 230.06

[56] References Cited

U.S. PATENT DOCUMENTS

| | | | |
|---|---|---|---|
| 4,379,342 | 4/1983 | Nakano et al. | 365/230.03 |
| 4,849,943 | 7/1989 | Pfennings | 365/230.06 |
| 4,926,385 | 5/1990 | Fujishima et al. | 365/230.03 |
| 5,031,146 | 7/1991 | Umina et al. | 365/230.01 |

OTHER PUBLICATIONS

"An Experimental 1-Mbit Cache DRAM with ECC", by Mikio Asakura et al., IEEE Journal of Solid-State Circuits, vol. 25, No. 1, Feb. 1990, pp. 5–10.

Primary Examiner—Eugene R. LaRoche
Assistant Examiner—Son Dinh
Attorney, Agent, or Firm—Lowe, Price, LeBlanc & Becker

[57] ABSTRACT

In a cache DRAM including a DRAM memory array and a SRAM memory array provided on the same chip, a plurality of pairs of MOS transistors are provided, as block transfer gates, so as to connect bit line pairs in the DRAM memory array and bit line pairs in the SRAM memory array one pair by one pair, and a data transfer amount controlling circuit for controlling the plurality of pairs of MOS transistors, a block including a predetermined number of pairs at a time, is newly provided. Data transfer amount controlling circuit is constructed to simultaneously turn on only pairs of MOS transistors included in blocks of a number in accordance with a predetermined external signal out of the plurality of pairs of MOS transistors. Therefore, the amount of data transferred at a time between the DRAM memory array and the SRAM memory array can be changed by changing the combination of the logical levels of external signals.

10 Claims, 6 Drawing Sheets

SEMICONDUCTOR MEMORY DEVICE HAVING ON THE SAME CHIP A PLURALITY OF MEMORY CIRCUITS AMONG WHICH DATA TRANSFER IS PERFORMED TO EACH OTHER AND AN OPERATING METHOD THEREOF

BACKGROUND OF THE INVENTION

1. Field of the Invention

The present invention relates to semiconductor memory devices, and, more particularly, to a semiconductor memory device having on the same chip a DRAM (Dynamic Random Access Memory) and a SRAM (Static Random Access Memory). Description of the Background Art Generally, a high-speed memory referred to as a cache memory is provided between a CPU (Central Processing Unit) and a main memory in a computer or the like. A main memory generally has a large capacity, so that it is difficult to implement a main memory with a high-speed memory in respect of costs, for example. Therefore, a method of increasing the operating speed of a main memory by using a high-speed memory having a small capacity is adapted. This high-speed memory having a small capacity is a cache memory. In execution of a program, a CPU first makes access to a cache memory. In a case where data of a designated address is in the cache memory, execution of the program is continued, and, in a case where data of a designated address is not in the cache memory, execution of the program is interrupted, and storage data in the cache memory and the main memory are exchanged so that the data of the designated address is transferred from the main memory to the cache memory. In many cases, a semiconductor memory such as a DRAM or the like with a small memory cell area having advantage in increasing the capacity is used as a main memory, while a semiconductor memory such as a SRAM or the like in which importance is attached to the operating speed rather than reduction in the memory cell area is used as a cache memory.

Conventionally, a cache memory and a main memory are provided on separate chips, so that it is necessary to provide a bus for transferring data between the main memory and the cache memory, and, accordingly, the structure of a storage device including the main memory and the cache memory is complicated. Therefore, it is proposed to implement a high-speed memory with a large capacity having a structure more simple than that of the conventional one by providing a DRAM and a SRAM on the same chip. Such a high-speed memory with a large capacity is described in Japanese Patent Laying-Open No. 62-38590 (1987), for example. A high-speed memory with a large capacity having a structure in which a DRAM and a SRAM are provided on the same chip is hereinafter referred to as a cache DRAM.

FIG. 5 is a schematic block diagram illustrating the whole structure of a conventional cache DRAM. Referring to FIG. 5, the cache DRAM includes a DRAM memory array 100 having memory cells (not shown) arranged in a matrix of 512 columns×512 rows and a SRAM memory array 200 having memory cells (not shown) arranged in a matrix of 512 columns×16 rows. A row decoder 110 selects one row out of the 512 memory cell rows in DRAM memory array 100. A column decoder 120 selects one column out of the 512 memory cell columns in DRAM memory array 100. A sense amplifier·I/O gate 130 includes sense amplifiers each for amplifying a storage data signal in DRAM memory array 100 and an I/O gate for performing giving and receiving of data between DRAM memory array 100 and the outside. One sense amplifier is provided corresponding to each bit line pair in DRAM memory array 100. The I/O gate controls giving and receiving of data between each sense amplifier and the outside.

A row decoder 210 selects one row out of the 16 memory cell rows in SRAM memory array 200. Column decoder 220 selects one column out of the 512 memory cell columns in SRAM memory array 200. An I/O gate 230 performs giving and receiving of data between SRAM memory array 200 and the outside. A data transfer gate 300 performs data transfer between DRAM memory array 100 and SRAM memory array 200. A data transfer controlling circuit 310 controls data transfer gate 300 in response to an externally applied controlling signal $\overline{TR}$. A column address buffer 320 designates memory cell columns to be selected by column decoders 120 and 220 in response to externally applied nine bit address signals A0–A8. A row address buffer 330 designates a memory cell row to be selected by row decoder 110 in response to the externally applied nine bit address signals A0–A8. A row address buffer 340 designates a memory cell row to be selected by row decoder 210 in response to external four bit address signals A9–A12 other than the external address signals A0–A8. When data is read from DRAM memory array 100 and when data is read from SRAM memory array 200, all of the sense amplifiers in sense amplifier·I/O gate 130 are activated. Bit line pairs in DRAM memory array 100 and bit line pairs in SRAM memory array 200 correspond to each other with one-to-one correspondence through data transfer gate 300.

SRAM memory array 200 is used as the cache memory, and DRAM memory array 100 is used as the main memory. Memory cells arranged in the same row are connected to the same word line (not shown), and memory cells arranged in the same column are connected to the same bit line pair (not shown), in both of DRAM memory array 100 and SRAM memory array 200.

When data is read from DRAM memory array 100, row decoder 110 selectively activates only one word line corresponding to a memory cell row designated by row address buffer 330 out of the 512 word lines in DRAM memory array 100. This causes storage data of 512 memory cells included in the one memory cell row designated by row address buffer 330 out of the memory cells in DRAM memory array 100 to appear onto corresponding bit line pairs, respectively. In sense amplifier·I/O gate 130, column decoder 120 electrically connects only a sense amplifier, which corresponds to one bit line pair connected to a memory cell column designated by column address buffer 320 out of 512 pairs of bit line pairs in DRAM memory array 100, to the I/O gate. Accordingly, only storage data in a memory cell included in the column designated by column address buffer 320 out of storage data in the 512 memory cells is amplified and then provided to the outside by sense amplifier·I/O gate 130.

When data is written into DRAM memory array 100, data is externally applied to the I/O gate in sense amplifier·I/O gate 130. Row decoder 110 and column decoder 120 operate in the same manner as in the case of reading data from DRAM memory array 100. Accordingly, the external data applied to the I/O gate in sense amplifier·I/O gate 130 is applied only to one bit line pair designated by column address buffer 320 through a corresponding sense amplifier. Row decoder 110 activates only one word line corresponding to a memory cell row designated by row address buffer 330 out of word lines in DRAM memory array 100, so-that the data applied to the one bit line pair through sense amplifier·I/O gate 130 is written only into a memory cells included in the memory cell row designated by row address buffer 330 out of 512 memory cells connected to that bit line pair.

When data is read from SRAM memory array 200, row decoder 210 and column decoders 120, 220 operate. Specifically, row decoder 210 selectively activates only one word line corresponding to a memory cell row designated by row address buffer 340 out of 16 word lines in SRAM memory array 200. This causes storage data in 512 memory cells included in the memory cell row designated by row address buffer 340 out of the memory cells in SRAM memory array 200 to appear on to corresponding bit line pairs, respectively. Column decoder 220 electrically connects only one bit line pair, which corresponds to a memory cell column designated by column address buffer 320 out of 512 bit line pairs in SRAM memory array 200, to I/O gate 230. Column decoder 120 operates in the same manner as in the case of writing data into DRAM memory array 100 and in the case of reading data from DRAM memory array 100. An output from column address buffer 320 is applied in common to column decoder 120 and 220, so that column decoders 120 and 220 select bit line pairs, which correspond to each other, from DRAM memory array 100 and SRAM memory array 200, respectively. At the same time, data transfer gate 300 is controlled by data transfer controlling circuit 310 to electrically connect each bit line pair in DRAM memory array 100 to a corresponding bit line pair in SRAM memory array 200. According to this, data appearing on each bit line pair in SRAM memory array 200 is transmitted through data transfer gate 300 to a corresponding bit line pair in DRAM memory 100. Then, the data transmitted to each bit line pair in DRAM memory array 100 is amplified by a corresponding sense amplifier in sense amplifier·I/O gate 130. Each amplified data is transmitted again through data transfer gate 300 to a corresponding bit line pair in SRAM memory array 200. Only one bit line pair selected by column decoder 220 out of bit line pairs in SRAM memory array 200 is electrically connected to I/O gate 230. Accordingly, in SRAM memory array 200, only storage data in a memory cell at crossing of the memory cell column designated by column address buffer 320 and the memory cell row designated by row address buffer 340 is provided through I/O gate 230 to the outside.

When data is written into SRAM memory array 200, data is externally applied to I/O gate 230, and row decoder 210, column decoders 220, 120, and data transfer gate 300 operate in the same manner as in the case of reading data from SRAM memory array 200. Accordingly, the external data applied to I/O gate 230 is amplified in sense amplifier·I/O gate 130 through a bit line pair corresponding to a memory cell column designated by column address buffer 320 and then, in SRAM memory array 200, is written into a memory cell at crossing of the memory cell column designated by column address buffer 320 and a memory cell row designated by row address buffer 340.

When data is transferred from DRAM memory array 100 to SRAM memory array 200, first, data transfer controlling circuit 310 controls data transfer gate 300 so that the bit line pairs in DRAM memory array 100 and the bit line pairs in SRAM memory array 200 are electrically separated. Then, with the bit line pairs in DRAM memory array 100 and the bit line pairs in SRAM memory array 200 being electrically separated, row decoder 110 operates, and the sense amplifiers in sense amplifier·I/O gate 130 are activated. This causes storage data in 512 memory cells in a memory cell row designated by row address buffer 330 to be read onto corresponding bit line pairs, respectively, in DRAM memory array 100. Then, row decoder 210 operates. This causes only a word line corresponding to a memory cell row designated by row address buffer 340 to be activated in SRAM memory array 200. Subsequently, data transfer controlling circuit 310 controls data transfer gate 300 so that the bit line pairs in DRAM memory array 100 and the bit line pairs in SRAM memory array 200 are electrically connected to each other. As a result, data read onto respective bit line pairs in DRAM memory array 100 are written through data transfer gate 300 into memory cells connected to the one activated word line in SRAM memory array 200. Specifically, storage data in memory cells in one row in DRAM memory array 100 are transferred in a lump into memory cells in one row in SRAM memory array 200.

When data is transferred from SRAM memory array 200 to DRAM memory array 100, first, data is read from SRAM memory array 200. Specifically, in a period during which data transfer controlling circuit 310 controls data transfer gate 300 so that the bit line pairs in DRAM memory array 100 and the bit line pairs in SRAM memory array 200 are electrically separated, row decoder 210 operates. This causes only a word line corresponding to a memory cell row designated by row address buffer 340 to be activated in SRAM memory array 200, so that storage data in 512 memory cells included in the designated memory cell row appear onto corresponding bit line pairs, respectively. Then, row decoder 110 operates, and the sense amplifiers in sense amplifier·I/O gate 130 are activated. According to this, in DRAM memory array 100, a word line corresponding to a memory cell row designated by row address buffer 330 is activated, and it becomes possible that data appearing on respective bit line pairs are amplified in sense amplifier·I/O gate 130. Then, data transfer controlling circuit 310 controls data transfer gate 300 so that the bit line pairs in DRAM memory array 100 and the bit line pairs in SRAM memory array 200 are electrically connected. This causes the data appearing on respective bit line pairs in SRAM memory array 200 to be written through data transfer gate 300 into memory cells connected to the one activated word line in DRAM memory array 100. Specifically, storage data in memory cells in one row in SRAM memory array 200 are transferred in a lump to DRAM memory array 100.

FIG. 6 is a circuit diagram illustrating the relations of connection between a SRAM memory array and a DRAM memory array in such-a conventional cache DRAM. Referring to FIG. 6, each of sense amplifiers 135 is provided corresponding to one of memory cell columns 1000 in DRAM memory array 100. Each of sense amplifiers 136 is provided corresponding to one of memory cell columns 2000 in SRAM memory array 200. Sense amplifiers 135 and 136 are included in sense amplifier·I/O gate 130 in FIG. 5. Two N-channel MOS transistors 305 and 306 ar provided between each sense amplifier 135 and a corresponding sense amplifier 136. Two N-channel MOS transistors 307 and 308 are provided between each sense amplifier 136 and a corresponding memory cell column 2000 in SRAM 200. Transistors 305 to 308 are included in data transfer gate 300 in FIG. 5. Gate potentials of transistors 305, 306 and transistors 307, 308 are provided in common from data transfer controlling circuit 310. Specifically, data transfer controlling circuit 310 provides a potential at a high level or a low level in response to an external controlling signal $\overline{TR}$ to electrically connect and separate DRAM memory array 100 and SRAM memory array 200. A differential amplifiers to which two signals of potentials complementary to each other are applied is used both as sense amplifier 135 and as sense amplifier 136.

In a mode in which data writing and data reading into/from DRAM memory array 100 are performed, the output potential of data transfer controlling circuit 310 attains the low level. Accordingly, transistors 305 and 306 are both turned off, so that each sense amplifier 135 differentially amplifies the potential of one bit line BLa1 included in a bit line pair connected to a corresponding DRAM memory cell column 1000 and the potential of the other bit line BLb1 included in the bit line pair connected to the corresponding DRAM memory cell column 1000. According to this, the potentials of bit lines BLa1, BLb1 in each bit line pair become complementary potentials in accordance with storage data in a memory cell connected to an activated word line out of the memory cells included in the corresponding DRAM memory cell column 1000.

In a mode in which data is read from SRAM memory array 200, the output potential of data transfer controlling circuit 310 attains the high level. Accordingly, in this case, transistors 305, 306 and transistors 307, 308 are all turned on, so that each sense amplifier 136 supplies to a corresponding sense amplifier 135 two signals of complementary potentials, which are obtained by differentially amplifying the potential of one bit line BLa2 included in a bit line pair connected to a corresponding SRAM memory cell column 2000 and the potential of the other bit line BLb2 included in the bit line pair connected to the corresponding SRAM memory cell column 2000, through corresponding transistors 305 and 306. Each sense amplifier 135 differentially amplifies two output signals of a corresponding sense amplifier 136. As a result, the potentials of bit lines BLa2, BLb2 in each bit line pair in SRAM memory array 200 become complementary potentials in accordance with storage data in a memory cell connected to an activated word line out of memory cells included in a corresponding memory cell column 2000.

In a mode in which data is transferred from DRAM memory array 100 to SRAM -memory array 200, after complementary potentials in accordance with storage data in each of memory cells connected to an activated word line in DRAM memory array 100 appears onto a corresponding bit line pair BLa1, BLb1, the output potential of data transfer controlling circuit 310 attains the high level. If the output potential of data transfer controlling circuit 310 attains the high level, two signals of complementary potentials obtained by differentially amplifying the potentials of corresponding bit lines BLa1 and BLb1 by sense amplifier 135 are applied through corresponding transistors 305 and 306 to a corresponding sense amplifier 136. Each sense amplifier 136 differentially amplifies two output signals of a corresponding sense amplifier 135, applies one of the two signals of complementary potentials obtained as a result of that through a corresponding transistor 307 to a corresponding bit line BLa2, and applies the other of the two signals of the complementary potentials through a corresponding transistor 308 to a corresponding bit line BLb2. Consequently, complementary potentials in accordance with storage data in each of memory cells connected to an activated word line in DRAM memory array 100 appear onto a corresponding bit line pair in SRAM memory array 200.

In a mode in which data is transferred from SRAM memory array 200 to DRAM memory array 100, after complementary potentials in accordance with storage data in each of memory cells connected to an activated word line in SRAM memory array 200 appear onto a corresponding bit line pair BLa2, BLb2, the output potential of data transfer controlling circuit 310 attains the high level. Accordingly, in this case, if the output potential of data transfer controlling circuit 310 attains the high level, each sense amplifier 136 applies two signals of complementary potentials obtained by differentially amplifying the potentials of a corresponding bit line pair BLa2, BLb2 through corresponding 305 and 306 to a corresponding sense amplifier 135. Each sense amplifier 135 differentially amplifies the two output signals of a corresponding sense amplifier 136, applies one of the two signals of complementary potentials obtained as a result of that to a corresponding bit line BLa1, and applies the other of the two signals of the complementary potentials to a bit line BLb1. Consequently, complementary potentials in accordance with storage data in each of memory cells connected to an activated word line in SRAM memory array 200 appear onto a corresponding bit line pair BLa1, BLb1 in DRAM memory array 100.

As described above, by using a cache DRAM, a data bus for transferring data from a main memory becomes unnecessary, and it becomes possible to transfer data of more bits (data in memory cells in one row) than in the conventional case at a time between a main memory, DRAM memory array 100, and a cache memory, SRAM memory array 200.

As described above, in a conventional cache DRAM, the number of memory cell columns in a DRAM memory array and the number of memory cell columns in a SRAM memory array are set to be the same, and data transfer between the DRAM memory array and the SRAM memory array is performed by block transfer in which each memory cell row in the memory arrays is made to be one block. Therefore, if the number of memory cell columns in the DRAM memory array and that in the SRAM memory array is assumed to be n, the amount of data which can be transferred at a time between the DRAM memory array and the SRAM memory array is fixed to n bits.

Now, a cache memory is provided for the purpose of apparently relieving a gap between an operation cycle of a CPU and the access time of a main memory; however, according to a so-called two-hierarchy system in which a single cache memory is provided between a CPU and a main memory, when a gap between the access time of the cache memory and the access time of the main memory is large, it is not possible to sufficiently relieve a gap between an operation cycle of the CPU and the access time of the main memory.

Specifically, if the access time of a main memory is considerably slower than the access time of a cache memory, in a case where storage data in the cache memory is sequentially transferred to the main memory, after certain data is applied to the main memory, the cache memory cannot apply the next data until the applied data is written into the main memory completely, and, in a case where storage data in the main memory is transferred to the cache memory, after certain data read out in the main memory is written, the cache memory cannot perform the next data writing until the next data is read out in the main memory completely. As a result, time required for reading data from the main memory to the CPU and for writing data from the CPU to the main memory is not so reduced. Therefore, recently, there are some cases where a so-called three-hierarchy memory configuration in which one more cache memory is provided between a cache memory and a main memory for relieving a gap between the access time of them is adopted. In a three-hierarchy memory configuration, first, a CPU makes access to one of two cache memories and thereafter makes access to the other cache memory only when desired data is not in the one cache memory. One of two cache memories which is accessed by the CPU is hereinafter referred to as a primary cache, and the other cache memory is hereinafter referred to as a secondary cache.

Now, it is assumed that a conventional cache DRAM is used as a secondary cache. As described above, the amount of data which can be transferred at a time between a SRAM memory array and a DRAM memory array is constant in a conventional cache DRAM. Therefore, a problem arises in a case where the size of a block in a primary cache and the size of a block in a secondary cache are different. This problem will be described with reference to FIG. 7. FIG. 7 is a diagram conceptually illustrating a three-hierarchy memory configuration in a case where a conventional cache DRAM is used as a secondary cache.

Referring to FIG. 7, in a case where it is desired to read data from a memory part 700, a CPU 400 first makes access to a primary cache 500. If data desired by CPU 400 is in primary cache 500, CPU 400 instructs primary cache 500 to read the desired data and continues execution of a program. However, if the data desired by CPU 400 is not in primary cache 500, CPU 400 interrupts execution of the program and makes access to secondary cache 600. Specifically, in a case where a desired data is in a SRAM memory array 200 in a cache DRAM used as secondary cache 600, CPU 400 instructs reading of the data from SRAM memory array 200, and, in a case where the desired data is not in SRAM memory array 200, CPU 400 instructs data transfer from a block in DRAM memory array 100 wherein the desired data is stored to a block in SRAM memory array 200. This causes all data of one block to be read from the block in SRAM memory array 200 to which data has been transferred from DRAM memory array 100 in response to instruction by CPU 400. The read data of the one block are transferred to one block in primary cache 500. CPU 400 indicates reading of data from the one block to primary cache 500 to obtain the desired data.

Thus, in a case where data desired by CPU 400 is in DRAM memory array 100 in secondary cache 600, all data in a block wherein the desired data is stored is transferred in a sequence of DRAM memory array 100—SRAM memory array 200—primary cache 500. Conversely, in a case where CPU 400 instructs storing of a desired data in primary cache 500 into DRAM memory array 100 in secondary cache 600, data in primary cache 500 is transferred, one block by one block, in a sequence of primary cache 500—SRAM memory array 200—DRAM memory array 100.

However, if the amount (m bits) of data in one block in primary cache 500 is larger than the amount (n bits) of data in one block in secondary cache 600, in a case where data desired by CPU 400 is in DRAM memory array 100, data transferred from SRAM memory array 200 to primary cache 500 fill only n/m of a block in primary cache 500. Specifically, when data in a block B1 out of blocks in primary cache 500 from which data should be finally read in accordance with instruction by CPU 400 and data in a block B2 in SRAM memory array 200 are exchanged, data which should be transferred from secondary cache 600 are not in a region of (m-n) bits of block B1, and there is no region to which data stored in advance in the region of (m-n) bits of block B1 are to be transferred in block B2 in SRAM memory array 200 to which data from block B1 is to be transferred.

Thus, if the size of a block in primary cache 500 and the size of a block in secondary cache 600 are different, there is a possibility of causing a so-called mishit in which an address of a destination of data transfer is not in a memory of the destination of data transfer when data in an arbitrary block in primary cache 500 and data in an arbitrary block in secondary cache 600 are exchanged.

However, in such a memory configuration of a three-hierarchy system, a mishit should be caused only in a case where data desired by CPU 400 is not in primary cache 500 and SRAM memory array 200. Accordingly, there should not be mishits caused on the occasion of data exchange between a block in primary cache 500 and a block in secondary cache 600 in CPU 400 which lower functionality of the whole system loaded with CPU 400 and memory circuitry 700.

In order to solve such a problem, it is desired that the amount of data transferred at a time from DRAM memory array 100 through data transfer gate 300 into one block in SRAM memory array 200 on the occasion of data exchange between an arbitrary block in primary cache 500 and an arbitrary block in SRAM memory array 200 should be equal to the amount of data in one block in primary cache 500.

However, the amount of data transferred at a time between SRAM memory array 200 and DRAM memory array 100 in a conventional cache DRAM is constant, so that it is not possible to avoid the problem as described above unless the size of a block in a cache DRAM used as secondary cache 600 is set appropriately in accordance with the size of a block in a memory used as primary cache 500. Accordingly, in order to solve the problem as described above by using a conventional cache DRAM, it is necessary to manufacture the cache DRAM to be used as secondary cache 600 with the size of a block being changed for sizes of a block in the memory used as primary cache 500, and the efficiency of manufacture becomes worse.

SUMMARY OF THE INVENTION

An object of the present invention is to provide a semiconductor memory device in which occurrence of a mishit is suppressed.

Another object of the present invention is to provide a high-speed semiconductor memory device with a large capacity in which the rate of occurrence of a mishit is small.

Still another object of the present invention is to provide a semiconductor memory device in which the tendency of a mishit, which is caused by the difference between the size of a block in a secondary cache and the size of a block in a primary cache, to occur is small in a case where the semiconductor memory device is used as the secondary cache.

A further object of the present invention is to provide a cache DRAM in which it is not necessary to manufacture blocks of various sizes in accordance with the aim of application.

A still further object of the present invention is to provide a semiconductor memory device in which it is possible to set appropriately the amount of data to be transferred between a plurality of types of memory arrays formed on the same chip in accordance with the size of a block in a primary cache.

According to an aspect, a semiconductor memory device of the present invention includes a first memory array having first memory cells arranged in a plurality of columns, a second memory array having second memory cells arranged in a plurality of columns corresponding to the plurality of columns, a plurality of first bit lines provided respectively corresponding to all the first memory cell columns in the first memory array, a plurality of second bit lines provided respectively corresponding to all the second memory cell columns in the second memory array, a plurality of switching circuits provided between and respectively corresponding to all the first bit lines and all the second bit lines, and a circuit for controlling the switching circuits. The switching circuits are divided into a plurality of blocks, and the circuit for controlling the switching circuits includes a selecting circuit for simultaneously selecting blocks of a number corresponding to a predetermined external signal out of the blocks and a circuit for simultaneously turning on all switching means included in the blocks selected by the selecting circuit.

Preferably, the first memory cell array and the second memory cell array are a DRAM memory cell array and a SRAM memory cell array, respectively, formed on the same semiconductor substrate.

According to another aspect, a semiconductor memory device of the present invention includes a plurality of blocks formed on the same semiconductor substrate, a terminal for receiving an external signal indicating the number of blocks, a block selecting circuit for simultaneously selecting blocks of the number in accordance with the external signal out of the plurality of blocks, and a controlling circuit for controlling data transfer in each block in response to an output of the block selecting circuit. Each block includes first memory cells arranged in a plurality of first columns, second memory cells arranged in a plurality of second columns corresponding to the plurality of first columns, a plurality of first bit lines provided corresponding to the plurality of first columns, a plurality of second bit lines provided corresponding to the plurality of second columns, and a plurality of switching circuits provided between the plurality of first bit lines and the plurality of second bit lines, respectively. The controlling circuit simultaneously turns on switching circuits included in the blocks selected by the block selecting circuit.

Preferably, in both of the above-described aspects, the block selecting circuit includes a holding circuit for taking in and holding an external signal and a decoding circuit for decoding the signal held by the holding circuit and an address signal indicating any column of a plurality of columns in a first memory array or a plurality of columns in a second memory array, and the controlling circuit includes a transfer controlling signal generating circuit for generating a transfer controlling signal for designating inhibition/permission of data transfer between the first memory array and the second memory array and a controlling signal generating circuit for generating a plurality of controlling signals corresponding to a plurality of blocks in response to the signals decoded by the decoding circuit and the transfer controlling signal. Each controlling signal is given in a lump to all switching circuits in the corresponding block.

According to still another aspect, a method of transferring data in accordance with the present invention is a method of transferring data between first memory cells and second memory cells in a semiconductor memory device provided with a plurality of blocks on the same semiconductor substrate each including first memory cells arranged in a plurality of first columns, second memory cells arranged in a plurality of second columns corresponding to the plurality of first columns, a plurality of first bit lines provided corresponding to the plurality of first columns, and a plurality of second bit lines provided corresponding to the plurality of second columns, wherein the method of transferring data includes the step of designating the amount of data to be transferred simultaneously between the first memory cells and the second memory cells, the step of simultaneously selecting blocks of a number corresponding to the designated amount of data, the step of reading data from each of the plurality of first memory cells arranged respectively in the plurality of first columns onto a corresponding first bit line, the step of transferring data read from the simultaneously selected blocks out of the read data to a corresponding second bit line, and the step of writing the transferred data into second memory cells arranged in the corresponding second columns.

Preferably, a plurality of switching circuits are provided, respectively, between the plurality of first bit lines and the plurality of second bit lines, and the step of transferring includes the step of turning on all switching circuits in the simultaneously selected blocks.

Since a semiconductor memory device according to the present invention and a method of transferring data inside the semiconductor memory device are constructed as described above, the plurality of switching circuits connecting bit lines provided corresponding to the first memory cell columns and bit lines provided corresponding to the second memory cell columns, respectively, are controlled simultaneously to be turned on, switching circuits of a number in accordance with a predetermined external signal at a time. Therefore, if the predetermined external signal is changed, number of switching circuits to be simultaneously turned on changes. When data is read from an array including the first memory cells, a storage data signal of a first memory cell connected to each first bit line appears onto the bit line, and when data is read from an array including the second memory cells, a storage data signal of a second memory cell connected to each second bit line appears onto the bit line. Accordingly,-by controlling the switching circuits as described above, it becomes possible to change the amount of data transferred at a time in accordance with the predetermined external signal when data read from the array including the first memory cells are transferred to the array including the second memory cells and when data read from the array including the second memory cells is transferred to the array including the first memory cells.

Therefore, according to the present invention, it is possible to change the amount of data to be transferred at a time between the array including the first memory cells and the array including the second memory cells provided on the same chip in accordance with the external signal. According to this, in a case where a semiconductor memory device of the present invention is used as a secondary cache by using a DRAM memory array and a SRAM memory array as the array of the first memory cells and the array of the second memory cells, respectively, it is possible to set the amount of data to be transferred as data for one block from the secondary cache to a primary cache in accordance with the size of a block in the primary cache, so that mishits do not occur during data exchange between the primary cache and the secondary cache. As a result, functionality of a system loaded with the primary cache and the secondary cache is enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
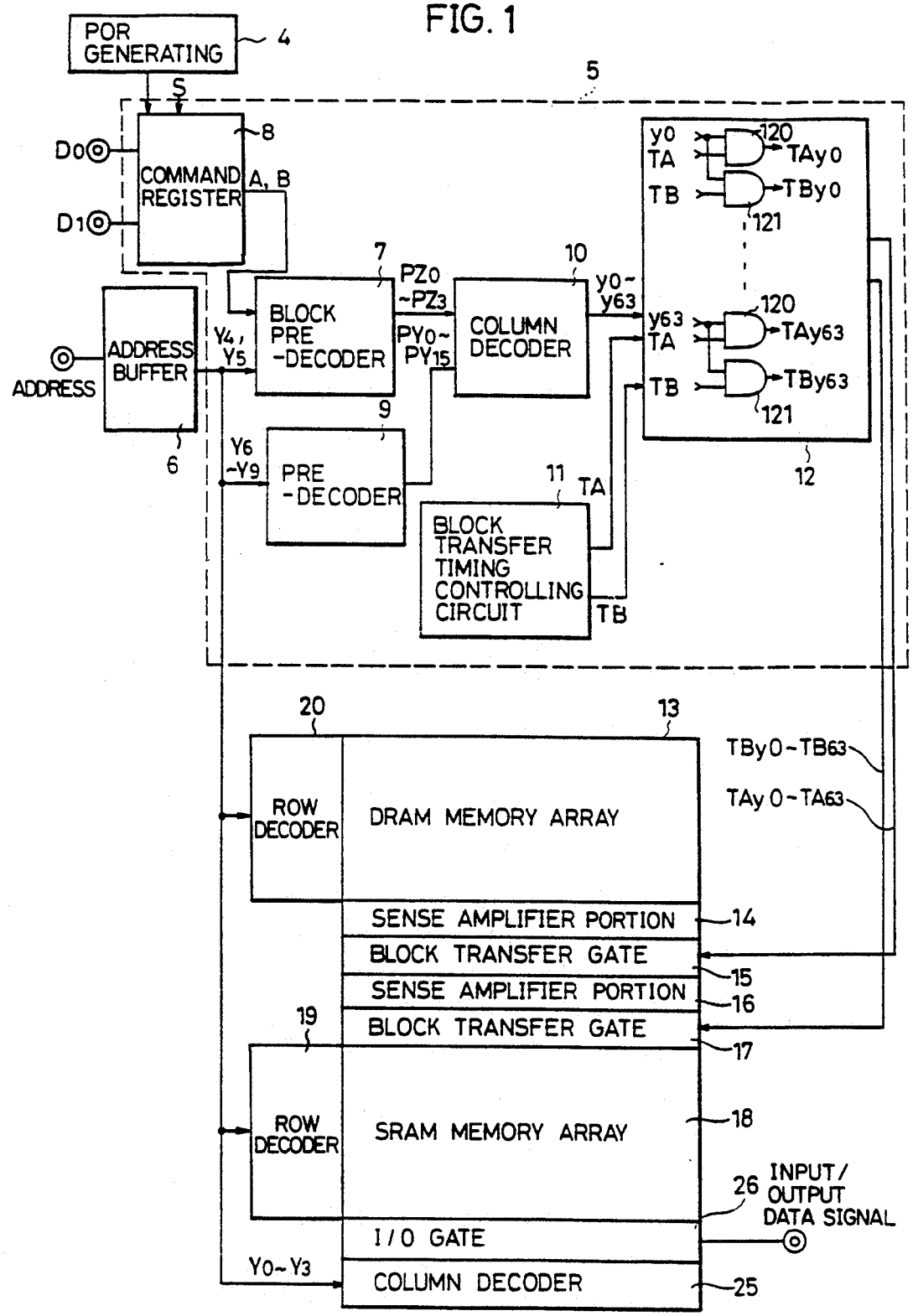
FIG. 1 is a schematic block diagram illustrating the whole structure of a cache DRAM according to an embodiment of the present invention.
Figure 5:
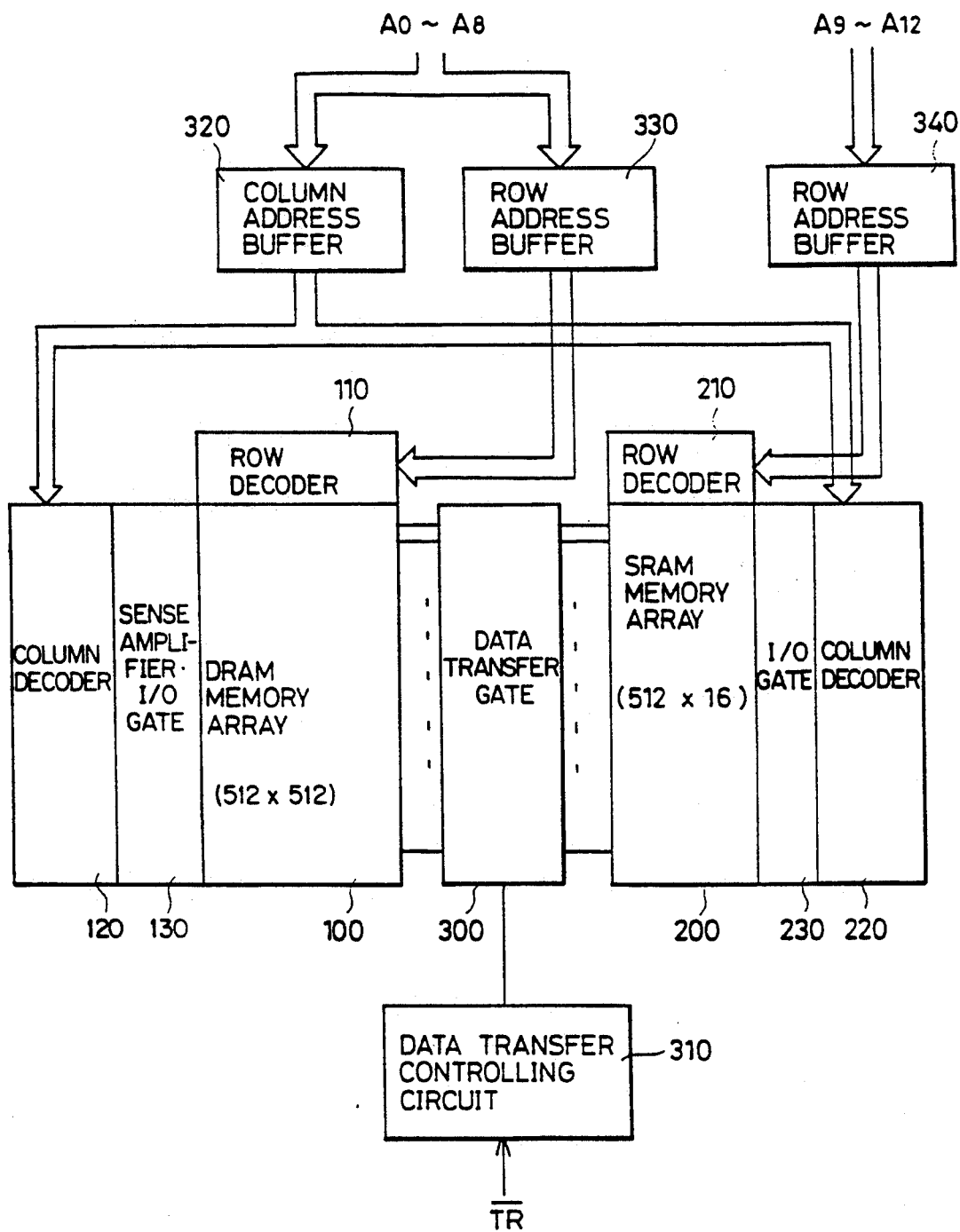
FIG. 5 is a schematic block diagram illustrating the whole structure of a conventional cache DRAM.
Figure 6:
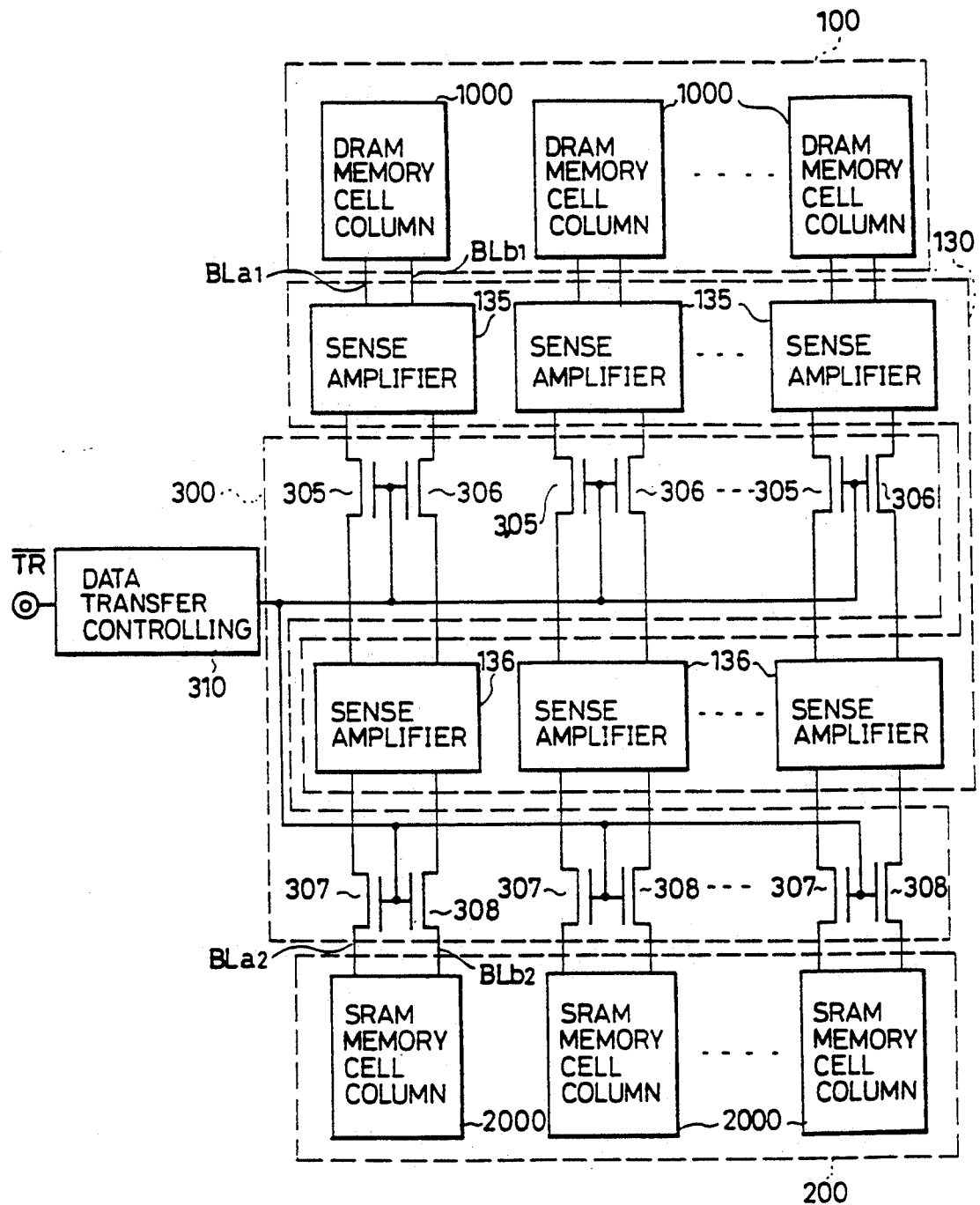
FIG. 6 is a circuit diagram illustrating relations of connection between a DRAM memory array and a SRAM memory array in a conventional cache DRAM.
Figure 7:
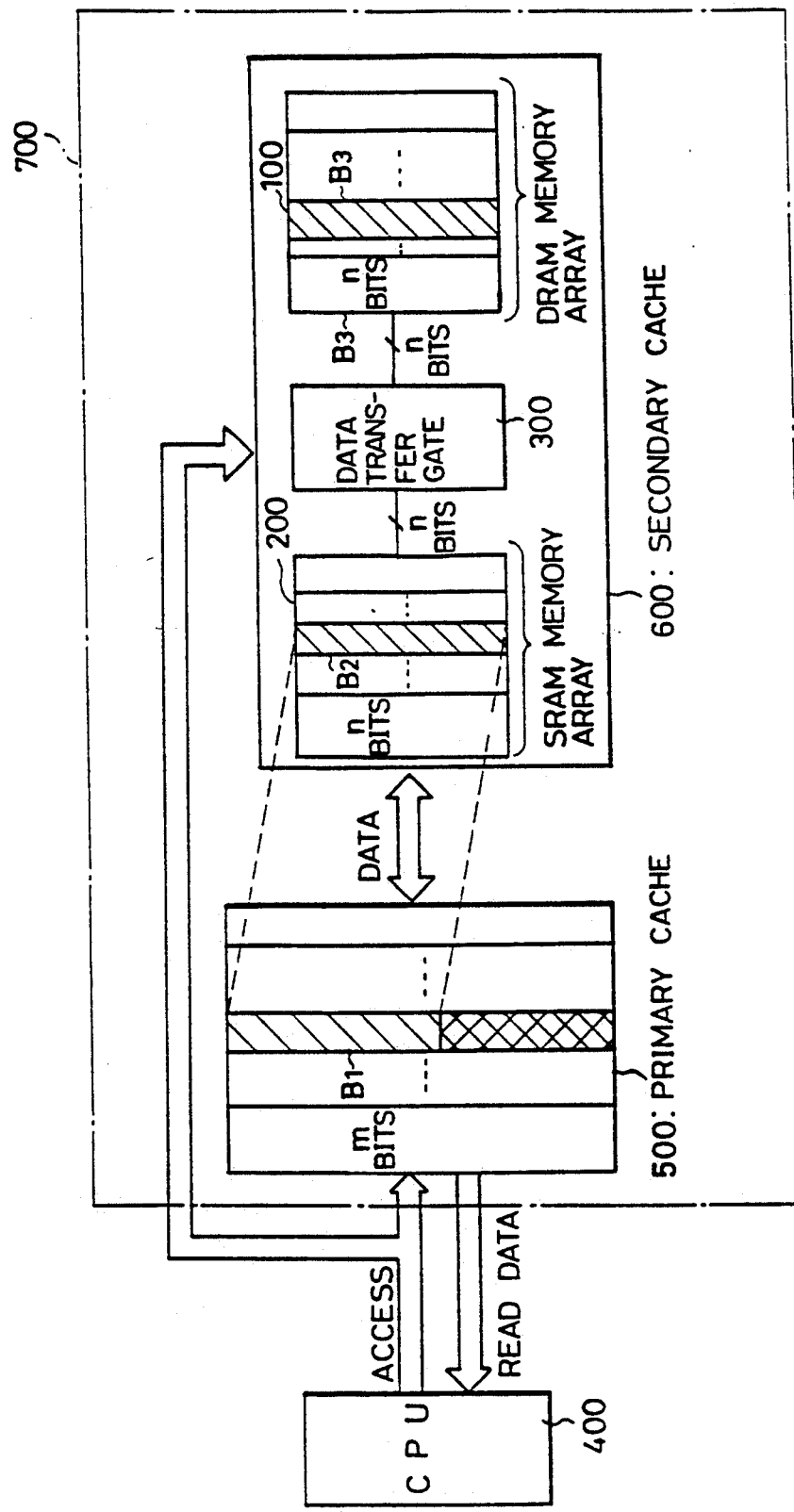
FIG. 7 is a diagram conceptually illustrating problems in a case where a conventional cache DRAM is used as a secondary cache.

FIG. 1 is a schematic block diagram illustrating the whole structure of a cache DRAM according to an embodiment of the present invention. Referring to FIG. 1, this cache DRAM differs from the conventional one in that this cache DRAM includes a data transfer amount controlling circuit 5 for determining the amount of data transferred at a time between a DRAM memory array 13 and a SRAM memory array 18 in accordance with an external signal and block transfer gates 15 and 17 for achieving data transfer between DRAM memory array 13 and SRAM memory array 18 in response to an output signal of data transfer amount controlling circuit 5. Block transfer gates 15 and 17 correspond to data transfer gate 300 in FIG. 5. The basic structure of parts of this cache DRAM other than data transfer amount controlling circuit 5 and block transfer gates 15, 17 is the same as the basic structure of corresponding parts of the conventional cache DRAM.

Writing and reading of data into/from DRAM memory array 13 and writing and reading of data into/from SRAM memory array 18 in the cache DRAM of this embodiment are performed in the same manner as in the case of the conventional cache DRAM, so that description of them will not be repeated. In the following description, stress will be laid on circuit operation for transferring data between DRAM memory array 13 and SRAM memory array 18.

Figure 2:
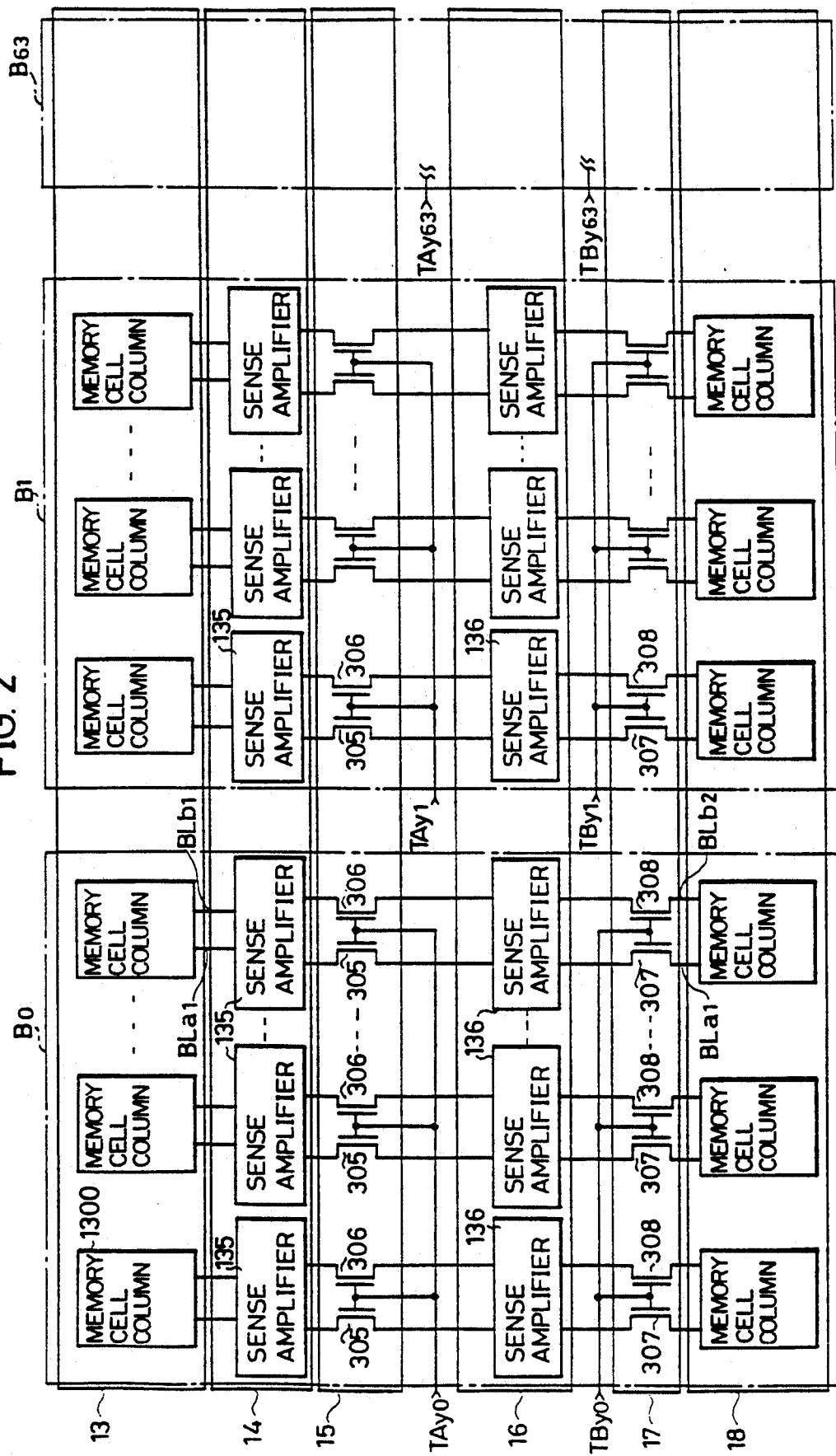
FIG. 2 is a circuit diagram illustrating the relations of connection between a DRAM memory array 13 and a SRAM memory array 18 in FIG. 1.

FIG. 2 is a diagram illustrating a specific circuit configuration between DRAM memory array 13 and SRAM memory array 18 in the cache DRAM according to this embodiment. Referring to FIGS. 1 and 2, both of DRAM memory array 13 and SRAM memory array 18 have memory cells arranged in a matrix of rows and columns as in the case of the conventional one. Sense amplifier circuitry 14 includes sense amplifiers 135 each provided corresponding to one of memory cell columns 1300 in DRAM memory array 13. Similarly, sense amplifier circuitry 16 includes sense amplifiers 136 each provided corresponding to one of memory cell columns 1800 in SRAM memory array 18. The number of memory cell columns 1300 in DRAM memory array 13 and the number of memory cell columns 1800 in SRAM memory array 18 are equal, and memory cell columns 1300 in DRAM memory array 13 correspond to memory cell columns 1800 in SRAM memory array 18 with a one-to-one correspondence.

A block transfer gate 15 includes N-channel MOS transistors 305, 306 provided between sense amplifiers 135 and corresponding sense amplifiers 136, respectively. A block transfer gate 17 includes N-channel MOS transistors 307, 308 provided between memory cell columns 1800 in SRAM memory array 18 and corresponding sense amplifiers 136, respectively.

Circuitry including DRAM memory array 13, sense amplifier parts 14, 16, block transfer gates 15, 17, and SRAM memory array 18 is divided in the column direction into 64 blocks B0–B63. The gates of transistors 305 and 306 included in block B0, the gate of transistors 305 and 306 included in block B1, . . . , and the gates of transistors 305 and 306 included in block B63 receive different controlling signals from data transfer amount controlling circuit 5. Similarly, transistor 307 and 308 included in block B0, transistors 307 and 308 included in block B1, . . . , and transistors 307 and 308 included in block B63 receive controlling signals different from each other from data transfer amount controlling circuit 5. Accordingly, transistors 305 and 306 in the same block are all brought to the same state (ON state or OFF state), and transistors 307 and 308 in the same block are also all brought to the same state (ON state or OFF state).

Word lines (not shown) are provided in common to the 64 blocks B0–B63 in both of DRAM memory array 13 and SRAM memory array 18. Therefore, a row decoder 20 can enable writing and reading of data into/from memory cells of one row in DRAM memory array 13 by activating one of the word lines in DRAM memory array 13 as in the case of the conventional one, and, similarly, a row decoder 19 can enable writing and reading of data into/from memory cells of one row in SRAM memory array 18 by activating one of word lines in SRAM memory array 18.

An address buffer 6, sense amplifiers 135 in sense amplifier circuitry 14, sense amplifiers 136 in sense amplifier circuitry 16, row decoders 19 and 20, an I/O gate 26, and a column decoder 25 operate in the same manner as those in the conventional cache DRAM. However, in this embodiment, column decoder 25 and I/O gate 26 are provided in common to both of DRAM memory array 13 and SRAM memory array 18.

Address buffer 6 buffers an externally applied address signal to apply a row address signal indicating any of the memory cell rows in DRAM memory array 13 and a row address signal indicating any of the memory cell rows in SRAM memory array 18 to row decoders 20 and 19, respectively, and to provide a column address signal designating any of memory cell columns 1300, 1800 in DRAM memory array 13 and SRAM memory array 18 to column decoder 25. Row decoder 20 activates only one word line connected to a memory cell row designated by the row address signal out of the word lines in DRAM memory array 13 in response to the row address signal from address buffer 6. Similarly, row decoder 19 activates only one word line connected to a memory cell row designated by a row address buffer signal out of the word lines in SRAM memory array 18 in response to the address signal from address buffer 6. Column decoder 25 electrically connects only a bit line pair BLa2, BLb2, which is included in a column designated by the column address signal out of bit line pairs BLa2, BLb2 in SRAM memory array 18 in response to the column address signal from address buffer 6, to I/O gate 26. Differently from the conventional case, an output signal of address buffer 6 is given not only to row decoders 19, 20 and column decoder 26 but also to data transfer amount controlling circuit 5.

Data transfer amount controlling circuit 5 includes a command register 8 which receives external signals D0 and D1, a block pre-decoder 7 and a pre-decoder 9 which receive an output signal of address buffer 6, a column decoder 10, a block transfer timing controlling circuit 11, and a block transfer signal generating circuit 12. In the following description, it is assumed that the number of memory cell columns included in each of blocks B0–B63 is sixteen. In this case, ten bit signals Y0–Y9 capable of indicating arbitrary one column out of the memory cell columns in DRAM memory array 13 or SRAM memory array 18 are given as an external column address signal to address buffer 6. Address buffer 6 buffers signals Y0–Y3 of four bits indicating any one of the memory cell columns in each of blocks B0–B63 out of signals Y0–Y9 to give the buffered signals to column decoder 25 and buffers signals Y4–Y9 of six bits capable of indicating any one block out of blocks B0–B63, to give the buffered signals to data transfer amount controlling circuit 5.

In data transfer amount controlling circuit 5, signals Y4, Y5 of the most significant two bits of signals Y4–Y9 from address buffer 6 are given to block pre-decoder 7, and signals Y6–Y9 of the rest least significant four bits. are given to pre-decoder 9. Pre-decoder 9 decodes four bit signals Y6–Y9 and converts them into sixteen bit signals PY0–PY15. Specifically, since data of $2^4$ (=16) types is represented by four bit signals Y6–Y9, decoding by pre-decoder 9 is performed so that the data of 16 types correspond to sixteen bit signals PY0–PY15 in which only a logical value of any one bit is "1" (16 types) with a one-to-one correspondence. Accordingly, only one of sixteen signals PY0–PY15 attains a high level corresponding to the logical value 1 in accordance with output signals Y6–Y9 of address buffer 6. Similarly, block pre-decoder 7 decodes two bit signals Y4, Y5 from address buffer 6 to convert them into four bit signals PZ0–PZ3 under the control of command register 8.

Figure 3:
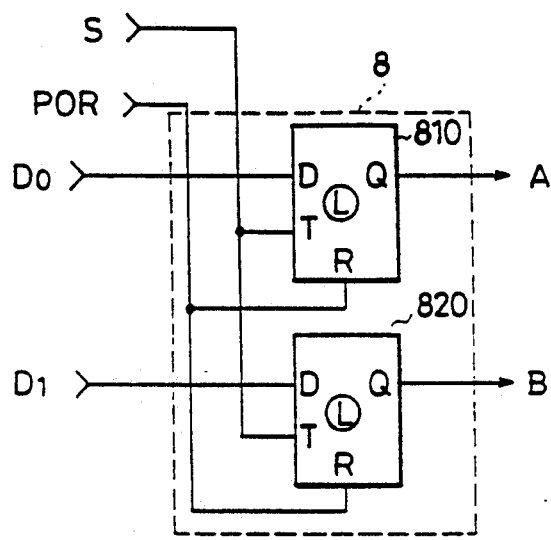
FIG. 3 is a circuit diagram illustrating an example of a structure of a command-register 8 in FIG. 1.

FIG. 3 is a circuit diagram illustrating a structure of command register 8. Referring to FIG. 3, command register 8 includes D-FFs (flip-flops) 810 and 820. Flip-flop 810 receives an external signal D0, a command register setting signal S, and a power on resetting signal POR at a data input terminal D, a clock terminal T, and a reset terminal R, respectively. Flip-flop 820 receives an external signal D1, command register setting signal S, and power on resetting signal POR at a data input terminal D, a clock terminal T, and a reset terminal R, respectively. Power on resetting signal POR is generated by a power on resetting signal generating circuit 4 in the cache DRAM. Power on resetting signal generating circuit 4 is conventionally provided in a semiconductor memory device and generates a one shot pulse in response to turning on of a switch for a power supply so that predetermined internal circuits in the semiconductor memory device is initialized into predetermined states at the start of its operation. This one shot pulse is power on resetting signal POR. In this embodiment, it is assumed that power on resetting signal POR is a one shot pulse having the high level. Accordingly, the potential of a data output terminal Q of flip-flop 810 is once initialized to a low level in response to turning on of the switch for the power supply, and, in a subsequent period, it is switched to the same logical level as the logical level of the potential of external signal D0 every time the potential of command register setting signal S attains the high level, and, in a period during which the potential of command register setting signal S is at the low level, it is held at a constant logical level regardless of a change in the potential of external signal D0. Similarly, the potential of an output terminal Q of flip-flop 820 is once initialized to the low level in response to turning on of the switch for the power supply, and, in a subsequent period, it is switched to the same logical level as the logical level of the potential of external signal D1 every time the potential of command register setting signal S attains the high level, and, if the potential of command register setting signal S is at the low level, it is held at a constant logical level regardless of a change in the potential of external signal D1. The potentials of output terminals Q of flip-flops 810 and 820 are controlling signals A and B to be given to block pre-decoder 7 in FIG. 1, respectively. Accordingly, if the potential of command register setting signal S is at the high level, the logical levels of the potentials of controlling signals A and B are ones corresponding to the potentials of external signals D0 and D1, respectively. Therefore, in a period during which command register setting signal S is at the high level, block pre-decoder 7 can be controlled by external signals D0 and D1.

Command register setting signal S is brought to the high level when data is transferred between DRAM memory array 13 and SRAM memory array 18, so that the logical levels of output signals A and B of command register 8 become ones corresponding to the logical levels of external signals D0 and D1 when data is transferred between DRAM memory array 13 and SRAM memory array 18. Command register setting signal S may be either externally applied or generated inside the cache DRAM.

Figure 4:
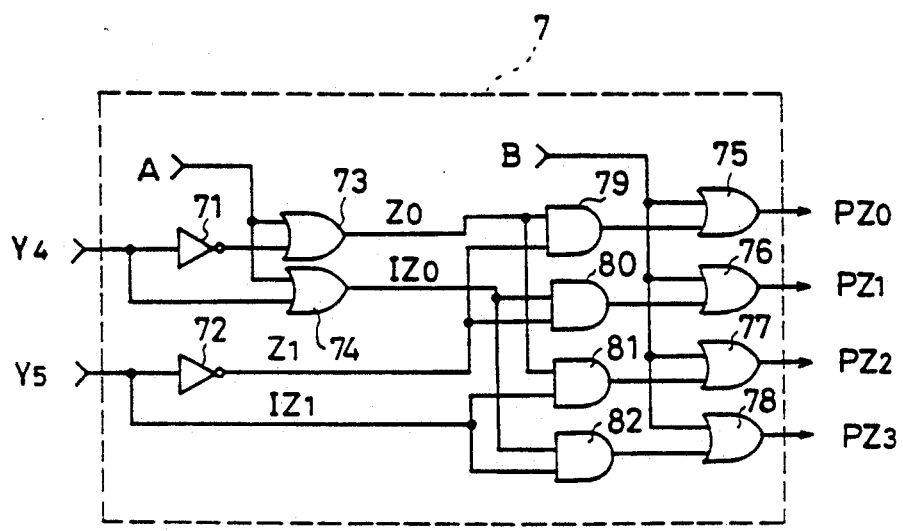
FIG. 4 is a circuit diagram illustrating an example of a structure of a block pre-decoder 7 in FIG. 1.

FIG. 4 is a circuit diagram illustrating a specific structure of block pre-decoder 7. Referring to FIG. 4, block pre-decoder 7 includes inverters 71 and 72 to which signals Y4 and Y5 are supplied from address buffer 6 as inputs, respectively, six two-input OR gates 73-78, and four two-input AND gates 79-82. OR gate 73 receives an output of inverter 71 and output signal A of command register 8 as inputs. OR gate 74 receives output signal A of command register 8 and output signal Y4 of address buffer 6 as inputs. Accordingly, the logical levels of output signals Z0 and IZ0 of OR gates 73 and 74 become complementary to each other only when the potential of signal A is at the low level, and, when the potential of signal A is at the high level, both of them become the high levels.

AND gate 79 receives output signal Z0 of OR gate 73 and an output signal Z1 of inverter 72 as inputs. AND gate 80 receives output signal IZ0 of OR gate 74 and an output signal Z1 of inverter 72 as inputs. And gate 81 receives output signal Z0 of OR gate 73 and a signal IZ1 (output signal Y5 of address buffer 6) at the input terminal of inverter 72 as inputs. And gate 82 receives output signal IZ0 of OR gate 74 and signal IZ1 at the input terminal of inverter 72 as input.

Accordingly, if signal A is at the low level, only the output logical level of one gate out of AND gates 79-82 becomes a high level in accordance with a combination of the logical levels of address signal Y4 and Y5. If the logical level of signal A is the high level, the logical levels of output signals Z0 and IZ0 of OR gates 73 and 74 are both fixed at the high level, so that only the output logical levels of two gates out of AND gates 79-82 become the high level in accordance with the logical level of address signal Y5. Specifically, if address signal Y5 is at the high level, the output logical levels of AND gates 79 and 80 both become the high level, and, if address signal Y5 is at the low level, the output logical levels of AND gates 81 and 82 both become the high level.

An output signal of AND gate 79, an output signal of AND gate 80, an output signal of AND gate 81, and an output signal of AND gate-82 are applied to one input terminal of OR gate 75, one input terminal of OR gate 76, one input terminal of OR gate 77, and one input terminal of OR gate 78, respectively. Output signal B of command register 8 is applied to the other input terminals of OR gates 75, 76, 77 and 78, respectively. Accordingly, if signal B is at the high level, output signals PZ0-PZ3 of OR gates 75-78 all attain the high level regardless of the output logical levels of AND gates 79-82. If signal B is at the low level, the output logical levels of OR gates 75, 76, 77 and 78 come to correspond to the output logical levels of AND gates 79, 80, 81 and 82, respectively. Output signals PZ0-PZ3 of OR gates 75-78 are output signals of block pre-decoder 7.

Therefore, if output signals A and B of command register 8 are both at the low level, only one of output signals PZ0-PZ3 of block pre-decoder 7 attains the high level, and, if output signals A and B of command register 8 are at the high level and at the low level, respectively, only two of output signals PZ0-PZ3 of block pre-decoder 7 attain the high level, and, if output signals A and B of command register 8 are at the low level and at the high level, respectively, output signals PZ0-PZ3 of block pre-decoder 7 all attain the high level.

Referring to FIG. 1 again, output signals PZ0-PZ3 of block pre-decoder 7 and output signals PY0-PY15 of pre-decoder 9 are applied to column decoder 10. Column decoder 10 decodes signals PZ0-PZ3, PY0-PY15 and converts them into sixty-four bit signals Y0-Y63.

Specifically, in a case where output signals PZ0-PZ3 of block pre-decoder 7 are all at the high level, only four signals out of output signals y0-y63 of column decoder 10 are brought to the high level in accordance with output signals PY0-PY15 of pre-decoder 9 are brought to the high level. For example, if signal PY0 is at the high level, signals y0-y3 are all brought to the high level, and, if signal PY1 is at the high level, signals y4-y7 are all brought to the high level, . . . , and, if signal PY15 is at the high level, signals y60-y63 are all brought to the high level. In a case where two of output signals PZ0-PZ3 of block pre-decoder 7 are at the high level, only two of signals y0-y63 are brought to the high level in accordance with the combination of the logical levels of signals PZ0-PZ3 and PY0-PY15. For example, in a case where signals PZ0 and PZ1 are both at the high level, if signal PY0 is at the high level, signals y0 and y1 are both brought to the high level, and, if signal PY1 is at the high level, signals y2 and y3 are brought to the high level, . . . , and, if signal PY15 is at the high level, signals y30 and y31 are brought to the high level. Similarly, in a case where signals PZ2 and PZ3 are both at the high level, if signal PY0 is at the high level, signals y32 and y33 are brought to the high level, and, if signal PY1 is at the high level, signals y34 and y35 are both brought to the high level, . . . and, if signal PY15 is at the high level, signals y62 and y63 are brought to the high level. If only one of output signals PZ0-PZ3 of block pre-decoder 7 is at the high level, only one of signals Y0-Y63 is brought to the high level in accordance with the combination of the logical levels of signals PZ0-PZ3 and signals PY0-PY15. For example, in a case where signal PZ0 is at the high level, if signal PY0 is at the high level, signal y0 is brought to the high level, and, if signal PY1 is at the high level, signal y1 is brought to the high level, . . . , and, if signal PY15 is at the high level, signal y15 is brought to the high level. Similarly, in a case where signal PZ1 is at the high level, if signal PY0 is at the high level, signal y16 is brought to the high level, and, if signal PY1 is at the high level, signal y17 is brought to the high level, . . . , and, if signal PY15 is at the high level, signal y31 is brought to the high level.

Similarly, in a case where signal PZ2 is at the high level, if signal PY0 is at the high level, signal y32 is brought to the high level, and, if signal PY1 is at the high level, signal y33 is brought to the high level, . . . , and, if signal PY15 is at the high level, signal y47 is brought to the high level. Similarly, in a case where signal PZ3 is at the high level, if signal PY0 is at the high level, signal y48 is brought to the high level, and, if signal PY1 is at the high level, signal y49 is brought to the high level, . . . , and, if signal PY15 is at the high level, signal Y63 is brought to the high level.

Output signals y0-y63 of column decoder 10 are applied to block transfer signal generating circuit 12. Block transfer signal generating circuit 12 includes two two-input AND gates 120 and 121 corresponding to each of signals y0-y63. Each of signals y0-y63 is applied to one input terminal of each of corresponding AND gates 120 and 121. An output signal TA of block transfer timing controlling circuit 11 is applied to another input terminal of each AND gate 120 in block transfer signal generating circuit 12. An output signal TB of block transfer timing controlling circuit 11 is applied to another input terminal of each AND gate 121 in block transfer signal generating circuit 12.

Accordingly, if signal TA is at the high level, a signal having the same logical level as the logical level of corresponding one of output signals y0–y63 of column decoder 10 is provided from each AND gate 120. However, if signal TA is at the low level, the output logical level of each AND gate 120 is fixed to the low level regardless of the logical level of a corresponding output signal of column decoder 10.

Similarly, if signal TB is at the high level, a signal having the same logical level as the logical level of corresponding one of output signals y0–y63 of column decoder 10 is provided from each AND gate 121. If signal TB is at the low level, the output logical level of each AND gate 120 is fixed to the low level regardless of the logical level of a corresponding output signal of column decoder 10.

Output signals of AND gate 120 provided corresponding to signal y0, AND gate 120 provided corresponding to signal y1, . . . , and, AND gate 120 provided corresponding to signal y63 are applied, respectively, as output signals TAy0, TAy1, . . . , and TAy63 of block transfer signal generating circuit 12 to block transfer gate 15.

Similarly, output signals of AND gate 121 provided corresponding to signal y0, AND gate 121 provided corresponding to signal y1, . . . , and AND gate 121 provided corresponding to signal y63 are applied, respectively, as output signals TBy0, TBy1, . . . , and TBy63 of block transfer signal generating circuit 12 to block transfer gate 17.

Referring to FIG. 2, output signals TAy0, TAy1, . . . , and TAy63 of block transfer signal generating circuit 12 are applied, respectively, to gates of transistors 305 and 306 in blocks B0, B1, . . . , and B63 in block transfer gate 15. Similarly, output signals TBy0, TBy1, . . . , and TBy63 of block transfer signal generating circuit 12 are applied, respectively, to gates of transistors 307 and 308 in blocks B0, B1, . . . , and B63 in block transfer gate 17.

Accordingly, in a period during which output signal TA of block transfer timing generating circuit 11 is at the high level, if only one of output signals PZ0–PZ3 of block pre-decoder 7 is at the high level, all transistors 305 and 306 included in one of blocks B0–B63 are turned on, and all transistors 305 and 306 included in the other blocks are turned off, and, if two of signals PZ0–PZ3 are at the high level, all transistors 305 and 306 included in two blocks (B0 and B1, or, B2 and B3, or, . . . , or, B62 and B63) out of blocks B0–B63 are turned on, and, if all of signals PZ0–PZ3 are at the high level, all transistors 305 and 306 included in four blocks (B0 B3, or, B4–B7, or, . . . , or, B60–B63) out of blocks B0–B63 are turned on.

Similarly, in a period during which output signal TB of block transfer timing controlling circuit 11 is at the high level, in a case where one of signals PZ0–PZ3 is at the high level, all transistors 307 and 308 included in one block out of blocks B0–B63 are turned on, and, if any two of signals PZ0–PZ3 are at the high level, all transistors 307 and 308 included in two blocks (B0 and B1, or, B2 and B3, or, . . . , or, B62 and B63) out of blocks B0–B63 are turned on, and, if all of signals PZ0–PZ3 are at the high level, all transistors 307 and 308 included in four blocks (B0–B3, or, B4–B7, or, . . . , or, B60–B63) out of blocks B0–B63 are turned on.

As described above, if output signal TA of block transfer timing controlling circuit 11 is at the high level, all transistors 305 and 306 included in blocks of a number in accordance with the combination of the logical levels of output signals A and B of command register 8 are turned on in block transfer gate 15, and, if output signal TB of block transfer timing controlling circuit 11 is at the high level, all transistors 307 and 308 included in blocks of a number in accordance with the combination of the logical levels of output signals A and B are turned on in block transfer gate 17. The combination of the logical levels of signals A and B is determined by the combination of the logical levels of external signals D0 and D1, so that if the logical levels of external signals D0 and D1 are fixed, and the combination of the logical levels of external address signals Y4–Y9 is changed so as to cause signals TAy0–TAy63 to attain the high level sequentially, signals of a number (1, or, 2, or, 4) determined by the combination of the logical levels of external signals D0 and D1 at a time, transistors 305 and 306 are turned on sequentially in blocks of the determined number in block transfer gate 15, and transistors 307 and 308 are turned on sequentially in blocks of the determined number in block transfer gate 17.

Conversely, if output signal TA of block transfer timing controlling circuit 11 is at the low level, all transistors 305 and 306 in block transfer gate 15 are turned off, and, if output signal TB of block transfer timing generating circuit 11 is at the low level, all transistors 307 and 308 in block transfer gate 17 are turned off.

Therefore, when data is transferred between DRAM memory array 13 and SRAM memory array 18, block transfer timing generating circuit 11 provides signals TA and TB at the high level. In addition, during this data transfer, the combination of the logical levels of external address signals Y4–Y9 is changed so that signals y0–y63 attain the high level sequentially, signal of a number determined by the combination of the logical levels of external signals T0 and T1 at a time. As a result, referring to FIG. 2, when data is transferred from DRAM memory array 13 to SRAM memory array 18, storage data in memory cells of one row connected to an activated word line in DRAM memory array 13 are transferred sequentially in blocks of the determined number (16 bits, 32 bits, 64 bits), through corresponding sense amplifiers 135 and 136 and corresponding transistors 305–308, to corresponding bit lines BLa2 and BLb2 in SRAM memory array 18. Conversely, when data is transferred from SRAM memory array 18 to DRAM memory array 13, storage data in memory cells of one row connected to an activated word line in SRAM memory array 18 are transferred sequentially in blocks of the determined number, through corresponding sense amplifiers 135 and 136 and corresponding transistors 305–308, to corresponding bit lines BLa1 and BLb2 in DRAM memory array 13.

As described above, in this cache DRAM, the amount of data transferred at a time between DRAM memory array 13 and SRAM memory array 18 can be varied to three types according to the combination of the logical levels of external signals D0 and D1. Specifically, if external signals D0 and D1 are both at the low level, one of output signals TAy0–TAy63 and one of signals TBy0–TBy63 of block transfer signal generating circuit 12 attain the high level simultaneously, so that the amount of data transferred at a time is sixteen bits, which corresponds to the number of memory cell columns included in one block, and, if external -signals D0 and D1 are at the high level and at the low level, respectively, two of signals TAy0–TAy63 and two of signals TBy0–TBy63 attain the high level, simultaneously, so that the amount of data transferred at a time is thirtytwo bits, which corresponds to the number of memory cell columns included in two blocks, and, if external signals D0 and D1 are at the low level and at the high level, respectively, four of signals TAy0-TAy63 and four of TBy0-TBy63 attain the high level simultaneously, so that the amount of data transferred at a time is sixty-four bits which corresponds to the number of memory cell columns included in four blocks.

Accordingly, in a case where this cache DRAM is used as a secondary cache, mishits as described above do not occur on the occasion of data exchange between a primary cache and the secondary cache if combination of the logical levels of external signals D0 and D1 is set so as to adapt the amount of data transferred at a time between DRAM memory array 13 and SRAM memory array 18 to the size of a block in a memory used as the primary cache.

While the amount of data transferred at a time can be varied to three types in the above embodiment because the number of blocks corresponding to the amount of data transferred at a time between the DRAM memory array and the SRAM memory array is set by two bit data of external signals D0 and D1, the amount of data transferred at a time may be variable to any number of types. For example, if signals of three or more bits is used as the external signal to be applied to command register 8 for setting the amount of data transferred at a time in the above embodiment, the amount of data transferred at a time becomes variable to four or more types, and, if data of one bit is used as the external signal, the amount of data transferred at a time becomes ,.variable to two types. Of course, in any cases, command register 8 must be constructed so as to take in and latch the external signals when data is transferred between DRAM memory array 13 and SRAM memory array 18, and block pre-decoder 7 must be constructed so that the number of output signals at the high level changes in accordance with the combination of the logical levels of signals supplied from command register 8.

The above-described amount of data transferred at a time also differs in accordance with the number of memory cell columns included in one block. The number of memory cell columns included in one block is not limited to the one (sixteen) shown in the above embodiment and may be any value. In addition, the number of blocks is also not limited to the one (sixty-four) shown in the above embodiment and may be any value.

Although signals PZ0-PZ3 for determining the number of blocks wherein transistors 305, 306, 307 and 308 are to be simultaneously turned on are generated in a circuit (block pre-decoder 7) in the first stage of a sequence of decoder circuits included in data transfer amount controlling circuit 5 in the above embodiment, such signals may be generated in any stage of the sequence of decoder circuits. For example, in the above embodiment, in a case where such signals are generated by a decoder other than block pre-decoder 7, that decoder may be controlled by an output signal of command register 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
  a first memory array formed on a semiconductor substrate, said first memory array including first memory cells arranged in a plurality of columns;
  a second memory array formed on the same semiconductor substrate as said first memory array, said second memory array including second memory cells arranged in a plurality of columns corresponding to said plurality of columns of said first memory array;
  a plurality of first bit lines provided corresponding to said plurality of columns of said first memory array;
  a plurality of second bit lines provided corresponding to said plurality of columns of said second memory array;
  a plurality of switching means provided, respectively between said plurality of first bit lines and said plurality of second bit lines, said plurality of switching means being divided into a plurality of blocks;
  means for receiving an external signal designating the number of blocks;
  block selecting means for simultaneously selecting blocks of the number designated by said external signals out of said plurality of blocks, said block selecting means comprising:
    holding means for taking in and holding said external signal; and
    decoding means for decoding a signal held by said holding means and an address signal indicating any of said plurality of columns in said first memory array or said second memory array; and
  control means for simultaneously turning on said switching means included in the blocks selected by said selecting means.

2. The semiconductor memory device according to claim 1, wherein said first memory cells are dynamic-type memory cells, and said second memory cells are static-type memory cells.

3. The semiconductor memory device according to claim 1, wherein said control means includes:
  transfer controlling signal generating means for generating a transfer controlling signal for designating inhibition/permission of data transfer between said first memory array and said second memory array; and
  controlling signal generating means for generating a plurality of controlling signals corresponding to said plurality of blocks in response to the signal decoded by said decoding means and said transfer controlling signal; and wherein
  each of said plurality of controlling signals is applied to all switching means included in a corresponding block in a lump.

4. The semiconductor memory device according to claim 3, wherein
  said decoded signal includes a plurality of signals corresponding to said plurality of blocks,
  said controlling signal generating means includes a plurality of logical circuit means provided corresponding to said plurality of blocks each for generating a logical multiplication signal of a corresponding signal out of said plurality of signals and said transfer controlling signal,
  said plurality of signals include activation signals of a number indicated by said held signal and deactivation signals of a number which is smaller than the number of said blocks by the number indicated by said held signal, and each of said activation signals activates corresponding logical circuit means, and each of said deactivation signals deactivates corresponding logical circuit means.

5. The semiconductor memory device according to claim 4, further comprising:
a plurality of first sense amplifier means provided corresponding to said plurality of columns of said first memory array for reading out data from first memory cells in corresponding columns, respectively; and
a plurality of second sense amplifier means provided corresponding to said plurality of columns in said second memory array for reading out data from said second memory cells in corresponding columns, respectively, wherein
each of said plurality of switching means includes;
first transfer gate means provided between said first sense amplifier means in the corresponding column and said second sense amplifier means in the corresponding column, and
second transfer gate means provided between said second sense amplifier means in the corresponding column and said second memory cells in the corresponding column.

6. The semiconductor memory device according to claim 5, wherein
said transfer controlling signal includes a first controlling signal for inhibiting/permitting data transfer between said plurality of first sense amplifier means and said plurality of second sense amplifier means and a second controlling signal for inhibiting/permitting data transfer between said plurality of second sense amplifier means and said second memory array, and wherein
each of said plurality of logical circuit means includes first generating means for generating a logical multiplication signal of the corresponding first controlling signal and the corresponding signal out of said plurality of signals and second generating means for generating a logical multiplication signal of the corresponding second controlling signal and the corresponding signal out of said plurality of signals.

7. The semiconductor memory device according to claim 1, wherein said semiconductor memory device is used as a secondary cache memory.

8. A semiconductor memory device, comprising:
a plurality of blocks formed on the same semiconductor substrate, each of said plurality of blocks including first memory cells arranged in a plurality of first columns, second memory cells arranged in a plurality of first columns, second memory cells arranged in a plurality of second columns corresponding to said plurality of first columns, a plurality of first bit lines provided corresponding to said plurality of first columns, a plurality of second bit lines provided corresponding to said plurality of second columns, and a plurality of switching means provided, respectively, between said plurality of first bit lines and said plurality of second bit lines;
means for receiving an external signal designating the number of blocks;
block selecting means for simultaneously selecting blocks of the number in accordance with said external signal received by said receiving means out of said plurality of blocks, said block selecting means comprising:
holding means for taking in and holding said external signal; and
decoding means for decoding a signal held by said holding means and an address signal indicating any of said plurality of columns in said first memory cells or said second memory cells; and
control means for simultaneously turning on switching means included in the blocks selected by said block selecting means.

9. A method of transferring data between first memory cells and second memory cells in a semiconductor memory device comprising a plurality of blocks each including said first memory cells arranged in a plurality of first columns, said second memory cells arranged in a plurality of second columns corresponding to said plurality of first columns, a plurality of first bit lines provided corresponding to said plurality of first columns, and a plurality of second bit lines provided corresponding to said plurality of second columns, said method of transferring data comprising the steps of:
indicating the amount of data to be transferred simultaneously between said first memory cells and said second memory cells;
simultaneously selecting blocks of a number corresponding to said indicated amount of data, said selecting step comprising the step of:
taking in and holding said number corresponding to said indicated amount of data; and
decoding said number and an address signal indicating any of said plurality of columns in said first memory cells or said second memory cells;
reading out data from each of said plurality of first memory cells arranged, respectively, in said plurality of first columns onto corresponding one of said first bit lines;
transferring data in said simultaneously selected blocks out of said read data to corresponding one of said second bit lines; and
writing said transferred data into the second memory cells arranged in the corresponding second column.

10. The method of transferring data according to claim 9, wherein
said semiconductor memory device further comprises a plurality of switching means provided, respectively, between said plurality of first bit lines and said plurality of second bit lines, and wherein
said step of transferring includes the step of simultaneously turning on the switching means included in said simultaneously selected blocks.

* * * * *